(12) United States Patent
Terasaki

(10) Patent No.: US 8,071,446 B2
(45) Date of Patent: Dec. 6, 2011

(54) MANUFACTURING METHOD OF SEMICONDUCTOR DEVICE AND SUBSTRATE PROCESSING APPARATUS

(75) Inventor: Tadashi Terasaki, Imizu (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 55 days.

(21) Appl. No.: 12/457,493

(22) Filed: Jun. 12, 2009

(65) Prior Publication Data

US 2009/0311876 A1    Dec. 17, 2009

(30) Foreign Application Priority Data

Jun. 13, 2008  (JP) .................................. 2008-155488
Apr. 22, 2009  (JP) .................................. 2009-104139

(51) Int. Cl.
*H01L 21/316* (2006.01)
(52) U.S. Cl. .. 438/261; 438/287; 438/591; 257/E21.179
(58) Field of Classification Search ................. 438/261, 438/287, 591, FOR. 193; 257/E21.179
See application file for complete search history.

(56) References Cited

U.S. PATENT DOCUMENTS

| | | | |
|---|---|---|---|
| 6,593,229 B1 * | 7/2003 | Yamamoto et al. | 438/635 |
| 6,737,341 B1 * | 5/2004 | Yamamoto et al. | 438/585 |
| 6,936,550 B2 * | 8/2005 | Yamamoto et al. | 438/778 |
| 7,521,316 B2 * | 4/2009 | Sohn et al. | 438/257 |
| 7,772,637 B2 * | 8/2010 | Sohn et al. | 257/316 |
| 2005/0282338 A1 * | 12/2005 | Yoo et al. | 438/257 |
| 2008/0135951 A1 * | 6/2008 | Kaushik | 257/410 |
| 2009/0239368 A1 * | 9/2009 | Park et al. | 438/592 |

* cited by examiner

*Primary Examiner* — George Fourson, III
(74) *Attorney, Agent, or Firm* — Oliff & Berridge, PLC

(57) ABSTRACT

A manufacturing method of a semiconductor device, including the steps of: loading into a processing chamber a substrate having a high dielectric gate insulating film and a metal electrode, with a side wall exposed by etching; applying oxidation processing to the substrate by supplying thereto hydrogen-containing gas and oxygen-containing gas excited by plasma, with the substrate heated to a temperature not allowing the high dielectric gate insulating film to be crystallized, in the processing chamber; and unloading the substrate after processing from the processing chamber.

7 Claims, 8 Drawing Sheets

| Hi-k | Temperature | Electrode | Ratio of oxygen (to hydrogen) |
|---|---|---|---|
| HfO | <400°C | TiN | <65% |
| HfSiO | <600°C | TiN | <40% |
| HfSiON | <1000°C | TiN | <60% | ured to a temperature of 850° C. or
MANUFACTURING METHOD OF SEMICONDUCTOR DEVICE AND SUBSTRATE PROCESSING APPARATUS

BACKGROUND

1. Technical Field

The present invention relates to a manufacturing method of a semiconductor device for processing a substrate having a high dielectric gate insulating film and a metal electrode, and a substrate processing apparatus.

2. Description of Related Art

In recent years, with high integration and high speed of a semiconductor device, a finer transistor and a thinner film are being developed. When the thinner film of a gate insulating film is progressed by this finer transistor, leak current of the gate electrode due to tunnel current, etc, is increased in a silicon oxide film ($SiO_2$ film) that has been used heretofore as the gate insulating film. Particularly, the gate insulating film does not function as an insulating film when the leak current is increased, unlike a capacitor insulating film, and therefore the leak current must be suppressed. Also, in the gate electrode, it is necessary to make electricity resistance small, increase conductivity, and accelerate operation characteristics. Therefore, study on the semiconductor device, with the gate insulating film made of a high dielectric material and the gate electrode made of metal, is being pursued. The gate insulating film made of a high dielectric material is called a high dielectric also called High-k gate insulating film, and the gate electrode made of metal is called a metal electrode hereinafter.

FIG. 9 shows main steps and typical processing contents of a process flow of a MOS transistor. In order to manufacture the MOS transistor, first, the gate insulating film is formed using the high dielectric material such as HfO and HfSiO on a silicon substrate (gate insulating film forming step).

Next, the gate electrode is formed using a metal material such as tungsten(W), ruthenium(Ru), titanium nitride(TiN), tantalum(Ta), molybdenum(Mo) instead of conventional polysilicon (gate electrode forming step).

Subsequently, processing of the gate electrode and the gate insulating film is performed by dry etching, through formation and processing of an etching mask (etching step). Thereafter, an etching damage of the gate electrode, namely, a physical roughness of a processing surface generated by etching is restored by thermal oxidation (restoration step of the gate electrode). When the restoration step is ended, ion implantation is performed to the surface of the silicon substrate, to thereby form source and drain. Subsequently, dopant (phosphorus (P), arsenic (As), and boron (B), etc, implanted to channel, source, and drain) is activated by annealing.

However, when the gate electrode is made of metal, the gate electrode is excessively oxidized in the restoration step of the gate electrode, and a resistance value is increased in some cases by oxidation.

As a method of suppressing excessive oxidation of the gate electrode, a method of reducing oxidation of the gate electrode by using hydrogen as a reducing agent, in a processing pressure of mixed gas of oxygen gas and hydrogen gas, with a temperature of the silicon substrate set to be a prescribed temperature of 850° C. or more, can be considered.

However, high dielectric materials such as hafnium (HfO), hafnium silicate ($HfSiO_x$, also called HfSiO hereunder), hafnium nitride silicate (HfSiON), and aluminum oxide ($AlO_x$) are sometimes crystallized, for example, by a thermal history of about 400° C. to 1000° C. Accordingly, when the silicon substrate is heated as described above to 850° C. or more, a High-k gate insulating film made of high dielectric material is sometimes formed into a polycrystal structure. A crystal grain boundary exists in the High-k gate insulating film having polycrystal structure, and therefore current flows through defects of the crystal grain boundary when a voltage is applied to the gate electrode, resulting in an increase of leak current.

SUMMARY OF THE INVENTION

Therefore, an object of the present invention is to provide a manufacturing method of a semiconductor device and a substrate processing apparatus capable of suppressing crystallization of a High-k gate insulating film and reducing leak current, when restoring etching damage of a metal electrode, namely a gate electrode made of metal.

According to a first aspect of the present invention, there is provided a manufacturing method of a semiconductor device, including the steps of:

loading into a processing chamber a substrate having a high dielectric gate insulating film and a metal electrode, with a side wall exposed by etching;

applying oxidation processing to the substrate in the processing chamber by supplying hydrogen-containing gas and oxygen-containing gas excited by plasma, with the substrate heated to a temperature not allowing the high dielectric gate insulating film to be crystallized; and unloading the substrate after processing from the processing chamber.

According to another aspect of the present invention, there is provided a substrate processing apparatus, including:

a processing chamber into which a substrate is loaded, having a high dielectric gate insulating film and a metal electrode, with a side wall exposed by etching;

a heating part heating the substrate loaded into the processing chamber;

a gas supply system supplying hydrogen-containing gas and oxygen-containing gas into the processing chamber;

a plasma generation part generating plasma in the processing chamber; and a controller controlling the heating part, the gas supply system, and the plasma generation part, with the controller controlling so that the substrate is heated by the heating part to a temperature not allowing the high dielectric gate insulating film to be crystallized, the hydrogen-containing gas and the oxygen-containing gas are supplied into the processing chamber by the gas supply system, then plasma is generated in the processing chamber by the plasma generation part, and oxidation processing is applied to the substrate by supplying thereto the hydrogen-containing gas and the oxygen-containing gas excited by plasma.

According to the present invention, it is possible to provide a manufacturing method of a semiconductor device and a substrate processing apparatus capable of suppressing crystallization of a High-k gate insulating film and reducing leak current, when etching damage of a metal electrode is restored.

DESCRIPTION OF PREFERRED
EMBODIMENTS OF THE INVENTION

Figure 1:
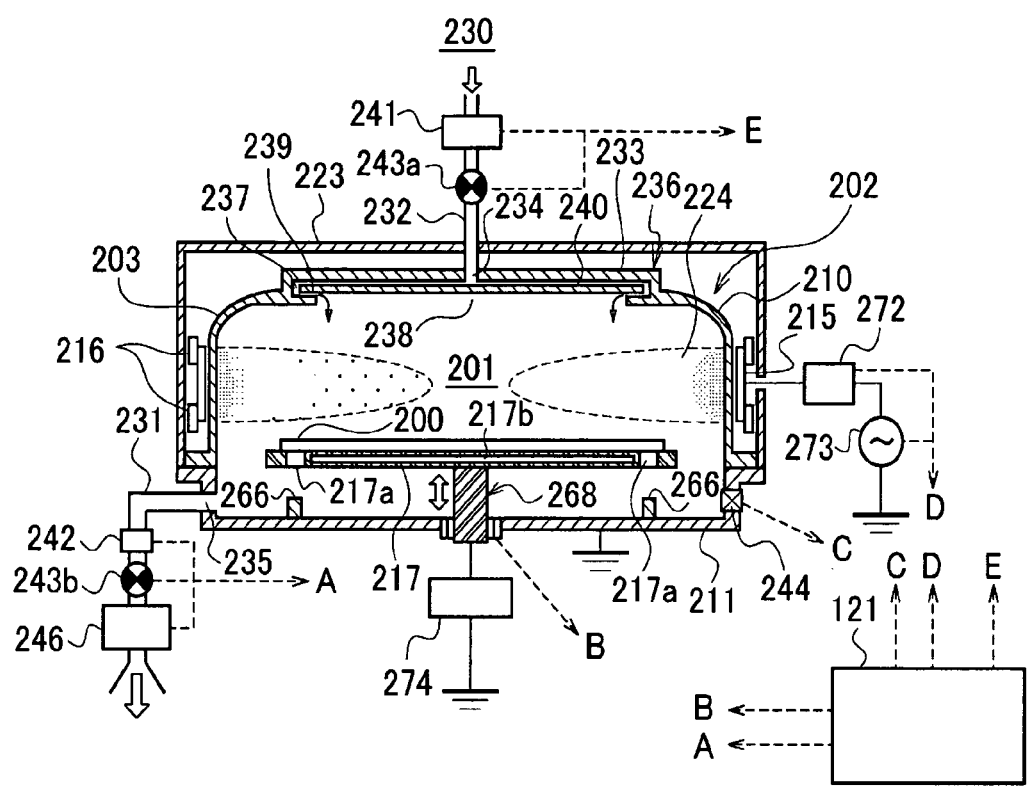
FIG. 1 is a schematic block diagram of an MMT apparatus, being a substrate processing apparatus according to a first embodiment of the present invention.

First Embodiment of the Present Invention (1) Structure of a Substrate Processing Apparatus A structure of a substrate processing apparatus according to a first embodiment of the present invention will be described hereunder, with reference to FIG. 1.

Note that the substrate processing apparatus according to this embodiment includes a modified magnetron typed plasma source capable of generating high density plasma by an electric field and a magnetic field. The modified magnetron typed plasma source is configured to cause magnetron discharge by forming the electric field and the magnetic field by supplying high frequency electric power to an electrode for discharge. Electrons emitted from the electrode for discharge are drifted and rotated while performing cycloid motion, to thereby heighten proportion of ionization and generate high density plasma of long service life. The substrate processing apparatus including the modified magnetron typed plasma source is also called a MMT apparatus. The MMT apparatus is configured to apply diffusion processing such as oxidizing or nitriding the substrate surface by making reaction gas excited and decomposed, or apply plasma processing of each kind to the substrate, such as forming a thin film on the substrate surface, etching the substrate surface, restoring the substrate surface by supplying oxide gas thereto, and suppressing oxidation of the substrate surface by supplying reductive gas thereto.

(Processing Vessel)

The MMT apparatus includes a processing vessel 203. The processing vessel 203 includes a dome-shaped upper side vessel 210, being a first vessel, and a bowl-shaped lower side vessel 211, being a second vessel. The upper side vessel 210 is put on the lower side vessel 211. The upper side vessel 210 is made of a non-metal material such as aluminum oxide or quartz. The lower side vessel 211 is made of aluminum. A processing chamber 201 is formed in the processing vessel 203. A wafer 200, being a substrate having a high dielectric gate insulating film and a metal electrode, with a sidewall exposed by etching, is loaded into the processing chamber 201. Note that, by forming the upper side vessel 210 using the non-metal material, metal contamination of the wafer 200 during processing of the substrate can be suppressed.

(Gas Supply System)

A shower head 236 as a gas supply part is provided in an upper part of the processing chamber 201. The shower head 236 includes a cap-like lid member 233, a gas supply port 234, a buffer chamber 237, an opening 238, a shielding plate 240, and a gas blow-out port 239. The buffer chamber 237 is constituted as a diffusion space for diffusing gas supplied from the gas supply port 234.

A downstream end of a gas supply pipe 232 capable of supplying processing gas 230, being hydrogen-containing gas, oxygen-containing gas, and mixed gas of the hydrogen-containing gas and the oxygen-containing gas, is connected to the gas supply port 234.

An upstream end of the gas supply pipe 232 is connected to a gas cylinder (not shown), being a supply source of the processing gas 230, through a valve 243a, being an open/close valve, and a mass flow controller 241, being a flow rate control unit (flow rate controller).

The gas supplied from the gas supply pipe 232 is supplied into the processing chamber 201, through the shower head 236. A gas supply system for supplying the processing gas 230, being the mixed gas of the hydrogen-containing gas and the oxygen-containing gas into the processing chamber 201 is constituted mainly by the shower head 236, the gas supply port 234, the gas supply pipe 232, the valve 243a, the mass flow controller 241, and a gas supply source (not shown).

(Gas Exhaust System)

A gas exhaust port 235 for exhausting atmosphere in the processing chamber 201 is provided on a lower side wall of the processing chamber 201. The processing gas 230 supplied into the processing chamber 201 flows in a direction of a bottom of the processing chamber 201, and is exhausted from the gas exhaust port 235. An upstream end of a gas exhaust pipe 231 is connected to the gas exhaust port 235. An APC 242, being a pressure adjuster, a valve 243b, being the open/close valve, a vacuum pump 246, being an exhaust apparatus, are provided in the gas exhaust pipe 231, sequentially from the upstream side. The gas exhaust system for exhausting the atmosphere in the processing chamber 201 is constituted mainly by the gas exhaust port 235, the gas exhaust pipe 231, the APC 242, the valve 243b, and the vacuum pump 246.

(Plasma Generation Part)

A cylindrical electrode 215, being a first electrode, is provided on an outer periphery of the processing vessel 203, so as to surround a plasma generation region 224 in the processing chamber 201. The cylindrical electrode 215 functions as a discharge mechanism (discharge part) for generating plasma in the processing chamber 201 and exciting the processing gas 230 supplied into the processing chamber 201. The cylindrical electrode 215 is formed into a columnar shape such as a cylindrical shape. A high frequency electric power source 273 for applying high frequency electric power is connected to the cylindrical electrode 215 via a matching unit 272 that performs matching of impedance.

In addition, a pair of opposed top/bottom cylindrical magnets 216, being a magnetic field forming mechanism (magnetic field forming part), are provided on the outer periphery of the processing vessel 203 (upper side vessel 210), so as to surround the plasma generation region 224 in the processing chamber 201. The cylindrical magnet 216 is constituted, for example, as a cylindrically formed permanent magnet. The pair of opposed top/bottom cylindrical magnets 216 are respectively disposed in the vicinity of upper/lower ends of the outer peripheral sides of the cylindrical electrode 215. The pair of opposed top/bottom magnets 216, 216 have magnetic poles on both ends (inner peripheral end and outer peripheral end) along a radius direction of the processing chamber 201, and are set so that directions of the magnetic poles of the pair of opposed top/bottom magnets 216, 216 are reversed from each other. Accordingly, magnetic poles on the inner peripheral part become different poles. Thus, magnetic line is formed in a direction of a cylindrical shaft along an inner peripheral surface of the cylindrical electrode 215.

The plasma generation part for generating plasma in the processing chamber 201 is constituted mainly by the cylindrical electrode 215, the pair of opposed top/bottom cylindrical magnets 216, the high frequency electric power source 273, and the matching unit 272. In addition, a shielding plate 223 for effectively shielding the electric field and the magnetic field is provided around the cylindrical electrode 215 and the cylindrical magnet 216, so that an external environment and an apparatus such as other processing furnace are not influenced by the electric field and the magnetic field formed by the cylindrical electrode 215 and the cylindrical magnet 216.

(Susceptor)

A susceptor 217 as a substrate holding tool (substrate holder) for holding the wafer 200 is disposed in a bottom side center of the processing chamber 201. The susceptor 217 is made of the non-metal material such as aluminum nitride and ceramics or quartz, with a heater 217b as a heating mechanism (heating part) integrally embedded inside, so that the wafer 200 can be heated. The heater 217b can heat the wafer 200 up to about 1000° C. by electric power applied thereto. By constituting the susceptor 217 by the non-metal material such as aluminum nitride and ceramics or quartz, metal contamination of the wafer 200 during processing the substrate can be suppressed.

In addition, a second electrode (not shown), being an electrode for changing impedance, is provided inside of the susceptor 217. The second electrode is grounded via an impedance variable mechanism 274. The impedance variable mechanism 274 is constituted of coil and a variable capacitor, etc, and by controlling the number of patterns of the coil and a capacitance value, etc, of the variable capacitor, a potential of the wafer 200 can be controlled via the second electrode (not shown) and the susceptor 217.

The susceptor 217 is electrically insulated from the lower side vessel 211. The susceptor 217 is supported from below by a susceptor elevating mechanism (elevation part) 268, and is constituted so as to be freely elevated. Through holes 217a are provided in at least three places of the susceptor 217. Wafer push-up pins 266 for pushing up the wafer 200 are respectively provided at positions corresponding to the through holes 217a, on a floor face (bottom face of the lower side vessel 211) of the processing chamber 201. When the susceptor 217 is lowered by the susceptor elevating mechanism 268, tip ends of the push-up pins 266 are penetrated the through holes 217a in a non-contact state with the susceptor 217, and the wafer 200 carried inside and outside of the processing chamber 201 is supported from below.

In addition, a gate valve 244, being a partition valve, is provided on the side wall of the lower side vessel 211. When the gate valve 244 is opened, the wafer 200 can be carried inside and outside of the processing chamber 201 by a carrying mechanism (carrier) not shown. Also, when the gate valve 244 is closed, the processing chamber 201 is air-tightly sealed.

In addition, the substrate processing apparatus includes a controller 121, being a control part. The controller 121 controls the APC 242, the valve 243b, and the vacuum pump 246 through a signal line A, controls the susceptor elevating mechanism 268 through a signal line B, controls the gate valve 244 through a signal line C, controls the matching unit 272 through a signal line D, controls the high frequency electric power source 273, controls the mass flow controller 241 through a signal line E, controls the valve 243a, and further controls the heater 217b embedded in the susceptor 217 and the impedance variable mechanism 274 through a signal line not shown.

(2) Substrate Processing Step

Figure 2:
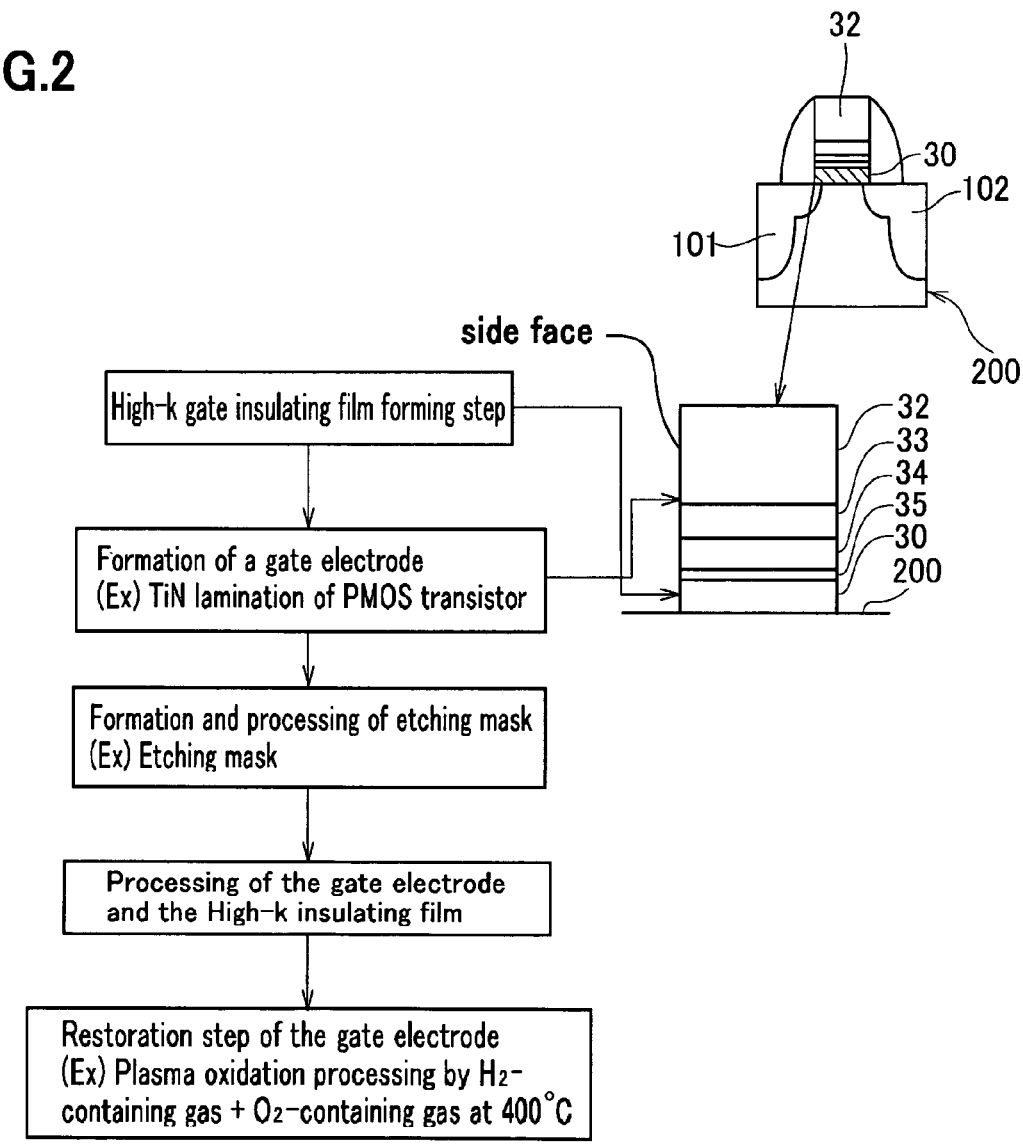
FIG. 2 is an explanatory view showing a sectional structure of a MOS transistor, being a semiconductor device according to the first embodiment and its manufacturing step.
Figure 6:
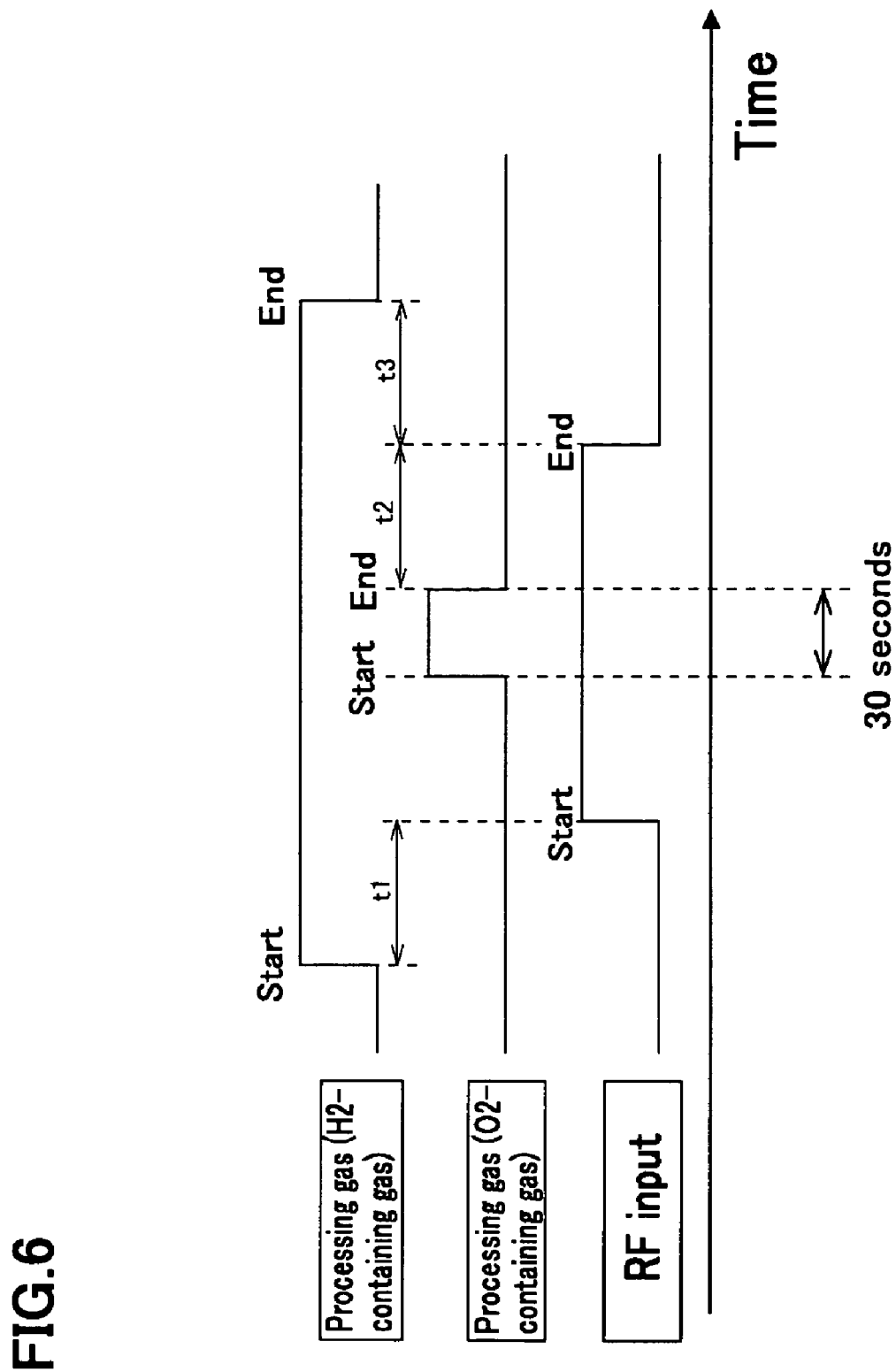
FIG. 6 is a view showing supply/stop timings of processing gas and start/stop timings of plasma processing in the restoration step of the gate electrode.

Next, as a step of the manufacturing step of a semiconductor device, a manufacturing method of the semiconductor device including the manufacturing steps of forming the High-k gate insulating film to restoring the gate electrode will be described, with reference to FIG. 1, FIG. 2, and FIG. 6. Note that the restoration step of the gate electrode as will be described later is executed by the aforementioned MMT apparatus. FIG. 2 shows a sectional structure of the MOS transistor, being the semiconductor device according to this embodiment, and shows its manufacturing steps. FIG. 6 is a view showing supply/stop timings of the processing gas, and start/stop timings of plasma processing in the restoration step of the gate electrode.

As shown in FIG. 2, the MOS transistor includes source 101 and drain 102 formed in the vicinity of the surface of the wafer 200 made of silicon. A channel part is formed between the source 101 and the drain 102. A High-k gate insulating film 30 is formed on the surface of the wafer 200 where the channel part is formed. A tunnel layer 35 made of $SiO_2$, etc, a floating layer 34 made of Poly-Si, etc, an ONO layer 33, and a gate electrode made of metal (metal electrode) 32, being a control gate layer are laminated on the High-k gate insulating film 30, sequentially from a lower layer. The ONO layer is constituted so as to insulate the floating layer from the gate electrode 32.

(High-k Gate Insulating Film Forming Step)

When the MOS transistor as shown in FIG. 2 is manufactured, first, the High-k gate insulating film 30 made of, for example, hafnium (HfO) is formed on the wafer 200. The High-k gate insulating film 30 is formed by supplying an organic metal material containing Hf and Si and remote plasma oxygen which are used in film deposition, by using a PLCVD(Poly-atomic layer CVD) method. Note that the High-k gate insulating film 30 may be made of not only hafnium but also other high dielectric material such as hafnium silicate (HfSiO), hafnium nitride silicate (HfSiON), and aluminum oxide ($AlO_x$).

(Gate Electrode Forming Step)

When formation of the High-k gate insulating film 30 is finished, the tunnel layer 35 made of $SiO_2$, etc, the floating gate layer 34 made of Poly-Si, etc, the ONO layer 33, and the gate electrode 32, being the control gate layer made of TiN, are respectively formed on the formed High-k gate insulating film 30 in a film shape. The gate electrode 32, being the control gate layer, can be formed by using a method such as sputtering or CVD. Note that the gate electrode 32 may be made of not only TiN but also other metal materials such as tungsten(W), ruthenium(Ru), titanium nitride(TiN), tantalum (Ta), molybdenum(Mo), and iridium (Ir). By suitably selecting the metal material forming the gate electrode 32, a threshold value voltage of the MOS transistor can be controlled.

(Formation of an Etching Mask and Processing Step)

When formation of the film-like tunnel layer 35, floating gate layer 34, ONO layer 33, and gate electrode 32 is completed, a resist film (not shown) is formed on the gate electrode 32. Then, the resist film is irradiated with exposure light, then the resist film after irradiation is developed, and a resist pattern (not shown) is formed, which covers an expected region of forming the channel part. Thereafter, an exposure part of the gate electrode 32, ONO layer 33, floating gate layer 34, tunnel layer 35, and the High-k gate insulating film 30 (expected regions of forming the source 101 and the drain 102) is removed by dry etching. Thereafter, the resist pattern is removed. Note that when the gate electrode 32 and the High-k gate insulating film 30 are etched, damage occurs on a side wall of the gate electrode 32, ONO layer 33, floating gate layer 34, tunnel layer 35, and High-k gate insulating film 30 (processing surface becomes physically rough).

(Restoration Step of the Gate Electrode)

When etching of the gate electrode 32, ONO layer 33, floating gate layer 34, tunnel layer 35, and High-k gate insulating film 30 is completed, the damage of the sidewall of the gate electrode 32, ONO layer 33, floating gate layer 34, tunnel layer 35, and High-k gate insulating film 30 is restored. Note that in the explanation given hereunder, an operation of each part constituting the MMT apparatus is controlled by the controller 121.

First, the wafer 200, being a restoration object, is loaded into the processing chamber 201 by a carrying mechanism (not shown). Specifically, first, the susceptor 217 is lowered down to a substrate carrying position, so that tip ends of the wafer push-up pins 266 are set in a protruded state by a prescribed portion higher than the surface of the susceptor 217. Next, the gate valve 244 formed in the lower side vessel 211 is opened, and the wafer 200 is placed on the tip ends of the wafer push-up pins 266 by the carrying mechanism (not shown). Then, the carrying mechanism is retreated to outside the processing chamber 201, and the gate valve 244 is closed. Thereafter, the susceptor 217 is elevated by the susceptor elevating mechanism 268, and the wafer 200 is transferred and placed on an upper surface of the susceptor 217. After the wafer 200 is transferred and placed thereon, the wafer 200 is further elevated up to a processing position by the susceptor elevating mechanism 268.

Next, the heater 217b embedded in the susceptor 217 is heated, and the loaded wafer 200 is held, with its temperature increased to a prescribed processing temperature. Specifically, processing temperature T of the wafer 200 is a temperature not allowing the High-k gate insulating film 30 to be crystallized, and for example, the wafer 200 is heated, so as to reach a prescribed processing temperature within a range of not less than a room temperature (25° C.) and less than 400° C. Moreover, inside of the processing chamber 201 is maintained to be set in a prescribed pressure, by using the vacuum pump 246 and the APC 242. Note that when the High-k gate insulating film 30 is made of hafnium silicate, the wafer 200 is heated, so that the processing temperature T becomes a prescribed processing temperature, for example, within a range of less than 600° C. Note that the processing temperature T is suitably decided according to a degree of the damage of the gate electrode 32 and a crystallization temperature, etc, of the high dielectric material constituting the High-k gate insulating film 30.

Next, as shown in FIG. 6, the open/close valve 243a is opened, to start supply of the hydrogen gas, being hydrogen-containing gas, into the processing chamber 201, while adjusting the flow rate using the mass flow controller 241. For example, the mass flow controller is adjusted so that the flow rate of the hydrogen gas is 950 sccm.

After elapse of prescribed time t1 from start of the supply of the hydrogen gas into the processing chamber 201, application of the high frequency electric power to the cylindrical electrode 215 from the high frequency electric power source 273 is started via the matching unit 272. Electric power applied to the cylindrical electrode 215 is set, so as to be a prescribed output value within a range of 300 to 700 W. At this time, the impedance variable mechanism 274 is controlled in advance, so as to be a desired impedance value. By this bias control, energy of plasma emitted to the wafer 200 can be adjusted. When the high frequency electric power is supplied to the cylindrical electrode 215, magnetron discharge occurs in the processing chamber 201 under an influence of a magnetic field of the cylindrical magnets 216, 216, then electric charge is trapped in an upper space of the wafer 200, and high density plasma caused by the hydrogen gas is generated in the plasma generation region 224.

After elapse of prescribed time from start of application of the high frequency electric power to the cylindrical electrode 215, supply of the oxygen gas, begin the oxygen-containing gas, into the processing chamber 201 is further started, while adjusting the flow rate by the mass flow controller 241. Namely, supply of the processing gas 230 is started into the processing chamber 201, which is a mixed gas of the hydrogen gas, being the hydrogen-containing gas, and the oxygen gas, being the oxygen-containing gas. The processing gas 230 is adjusted, so that a flow-rate ratio of the oxygen gas to the hydrogen gas is 65% or less. For example, the processing gas 230 is adjusted, so that when the flow rate of the hydrogen gas is 950 sccm, the flow rate of the oxygen gas is 617.5 sccm or less and preferably 50 sccm. Note that such a flow-rate ratio is suitably decided, according to a degree of a damage of the gate electrode 32 and the High-k gate insulating film 30, and a crystallization temperature, etc, of the high dielectric material constituting the High-k gate insulating film 30.

When the processing gas 230, being the mixed gas of the hydrogen gas and the oxygen gas, is supplied into the processing chamber 201, high density plasma caused by the oxygen gas and the hydrogen gas is generated in the plasma generation region 224. Then, the hydrogen gas and the oxygen gas excited by the high density plasma are supplied to the wafer 200, and oxidation processing is performed. Namely, by this high density plasma, oxygen active species and hydrogen active species are generated, and by the generated oxygen active species and the hydrogen active species, restoration processing is applied to the side face of the gate electrode 32 on the wafer 200.

In this restoration processing, by the oxygen active species, the side face of the gate electrode 32, being a control gate layer, is oxidized, and etching damage, namely, a physical roughness is restored, and by the hydrogen active species, excessive oxidation of the side face of the gate electrode 32 is suppressed by oxidation-reduction reaction.

Further, by selectively oxidizing the side wall of the tunnel layer 35, floating gate layer 34, ONO layer 33, and High-k gate insulating film 30, generation of the leak current on such a side wall can be suppressed.

Thereafter, after elapse of a prescribed time (for example 30 seconds), the supply of the oxygen gas into the processing chamber 201 is stopped. Then, after elapse of prescribed time t2, application of the high frequency electric power to the cylindrical electrode 215 is stopped. Thereafter, after further elapse of prescribed time t3, the supply of the hydrogen gas into the processing chamber 201 is stopped.

Thus, after the supply of the hydrogen gas into the processing chamber 201 is started, the application of the high frequency electric power to the cylindrical electrode 215 is started after prescribe time t1 delay, and thereafter, the supply of the oxygen gas into the processing chamber 201 is started after further prescribed time delay. Here, supply start timing of the hydrogen gas into the processing chamber 201, application start timing of the high frequency electric power to the cylindrical electrode 215, and supply start timing of the oxygen gas into the processing chamber 201 are respectively adjusted, so that activation timing of the hydrogen gas supplied into the processing chamber 201, and activation timing of the oxygen gas supplied into the processing chamber 201 coincide with each other. Thus, oxidation-reduction action of the hydrogen active species and oxidation action of the oxygen active species can be started at a satisfactory timing, then the side face of the gate electrode 32 is oxidized and restored, and the excessive oxidation of the side face of the gate electrode 32 can be suppressed.

In addition, after the supply of the oxygen gas into the processing chamber 201 is stopped, application of the high frequency electric power to the cylindrical electrode 215 is stopped after prescribed time t2 delay, and thereafter supply of the hydrogen gas into the processing chamber 201 is stopped after further prescribed time t3 delay. Here, supply stop timing of the oxygen gas into the processing chamber 201, application stop timing of the high frequency electric power to the cylindrical electrode 215, and supply stop timing of the hydrogen gas into the processing chamber 201 are respectively adjusted, so that disappearance timing of the hydrogen active species in the processing chamber 201 and disappearance timing of the oxygen active species in the processing chamber 201 coincide with each other. Thus, the oxidation-reduction action of the hydrogen active species and the oxidation action of the oxygen active species are finished at a satisfactory timing, then the side face of the gate electrode 32 is oxidized and restored, and excessive oxidation of the side face of the gate electrode 32 can be suppressed.

Note that the supply time of the high frequency electric power to the cylindrical electrode 215 and the supply time of the oxygen-containing gas and the hydrogen-containing gas into the processing chamber 201, are suitably adjusted according to the etching damage of the side face of the gate electrode 32, which is generated by dry etching.

When the restoration step of the gate electrode is finished, the wafer 200 after restoration processing is carried to outside the processing chamber 201, in a procedure opposite to the procedure of loading the wafer, by using the carrying mechanism (not shown), and is then loaded into a processing furnace of an ion implantation apparatus. Then, ion implantation is applied to a region where the source 101 and the drain 102 of the silicon 200 are scheduled to be formed, to thereby form the source 101 and the drain 102. Subsequently, activation of dopant (phosphorus (P), arsenic (As), boron (B), etc, implanted to channel, source, drain) is performed by annealing.

(3) Advantages According to this Embodiment

According to this embodiment, one or a plurality of advantages shown hereunder are exhibited.

(a) According to this embodiment, the oxidation processing is applied to the wafer 200, by supplying thereto the hydrogen-containing gas and the oxygen containing gas excited by plasma, with the wafer 200 heated to a temperature not allowing the High-k gate insulating film 30 to be crystallized. For example, when the High-k gate insulating film 30 is formed by hafnium, the wafer 200 is heated, so that temperature T becomes a prescribed processing temperature within a range of not less than room temperature (25° C.) and less than 400° C. Also, when the High-k gate insulating film 30 is formed by hafnium silicate, the wafer 200 is heated, so that temperature T becomes a prescribed processing temperature within a range of less than 600° C. Thus, it is possible to prevent the High-k gate insulating film 30 from having a polycrystal structure, and prevent a grain boundary from being formed in the High-k gate insulating film 30. Then, it is also possible to prevent a current flow through a defect of the grain boundary when a voltage is applied to the gate electrode 32, and the leak current can be reduced.

(b) According to this embodiment, the processing gas 230 supplied into the processing chamber 201 is adjusted, so that the flow-rate ratio of the oxygen gas to the hydrogen gas becomes 65% or less. For example, the ratio is adjusted, so that the flow rate of the hydrogen gas is 950 sccm, and the flow rate of the oxygen gas is 50 sccm. Thus, when the side wall of the gate electrode 32 is restored by plasma oxidation, excessive oxidation of the gate electrode 32 can be suppressed. Thus, excessive oxidation of the gate electrode 32 can be suppressed, and an increase of a resistance value of the gate electrode 32 due to oxidation can be suppressed.

Figure 3:
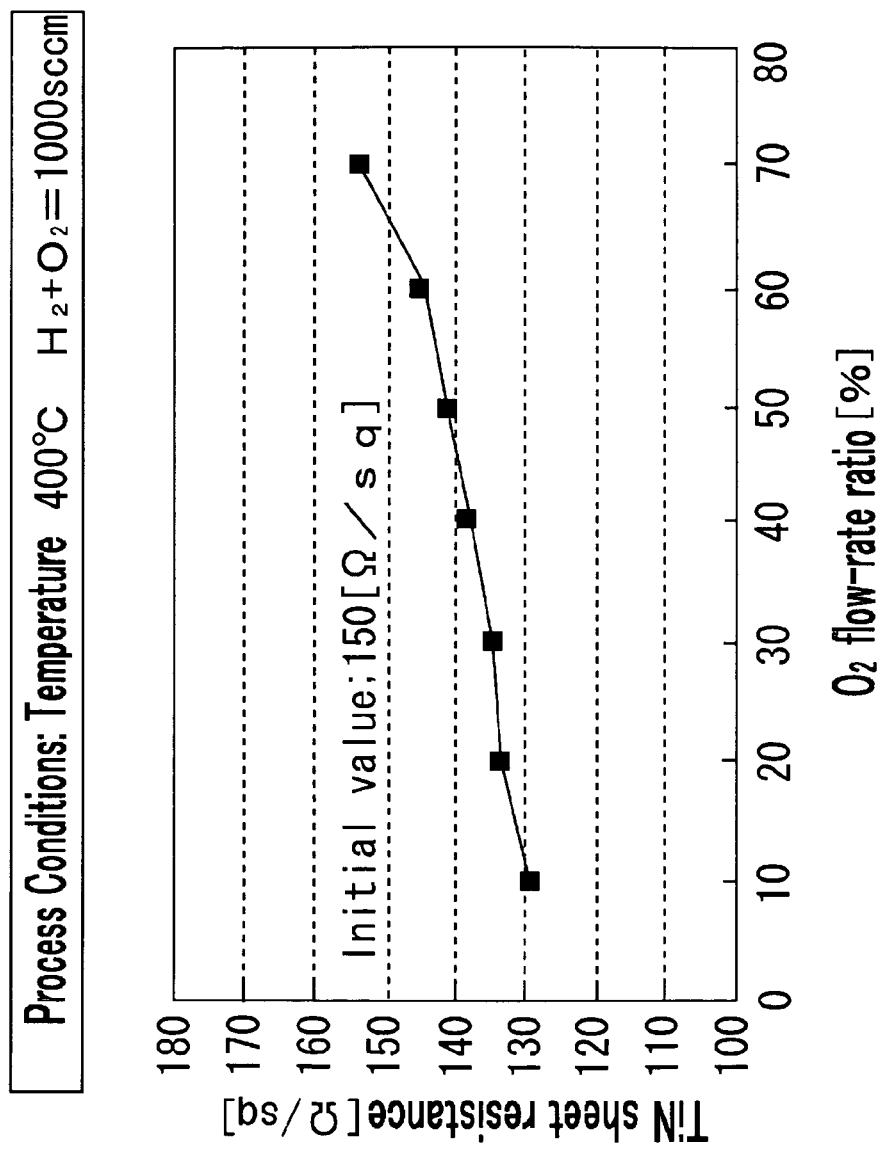
FIG. 3 is a graph chart showing a relation between a flow rate of oxygen gas to hydrogen gas, and sheet resistance values of a gate electrode made of TiN.

In order to decide a suitable flow-rate ratio of the oxygen gas to the hydrogen gas, being one parameter of the restoration step of the gate electrode 32, inventors of the present invention measured a sheet resistance value at the time of changing the flow-rate ratio of the oxygen gas to the hydrogen gas with increment of 10%, namely measured the change of the resistance value per unit area. FIG. 3 is a graph chart showing a relation between the flow-rate ratio of the oxygen gas to the hydrogen gas, and the sheet resistance value of the gate electrode made of TiN. In FIG. 3, the change of the sheet resistance value is taken on the vertical axis, and the flow-rate ratio of the oxygen gas to the hydrogen gas is taken on the horizontal axis. In FIG. 3, the processing temperature of the wafer 200 is fixed to 400° C., and total flow rate of the hydrogen gas and the oxygen gas is set to be 1000 sccm. In the figure, "initial value" shows the sheet resistance value of the gate electrode 32 before the restoration step is executed. The sheet resistance value (initial value) of the gate electrode 32 was 150 [Ω/sq] before the restoration step is executed.

As shown in FIG. 3, when the flow-rate ratio of the oxygen gas to the hydrogen gas is changed in such a manner as 10[%], 20[%], 30[%], 40[%], 50[%], 60[%], and when the side face of the gate electrode 32 is restored by plasma oxidation at a constant processing temperature 400° C., it is found that the sheet resistance value is increased, approximately in proportion to the flow-rate ratio of the oxygen gas to the hydrogen gas. In addition, when the flow-rate ratio of the oxygen gas to the hydrogen gas exceeds 65[%], it is found that the sheet resistance value exceeds the initial value 150 [Ω/sq]. In addition when the flow-rate ratio of the oxygen gas to the hydrogen gas is decreased, it is found that excessive oxidation of the gate electrode 32 is suppressed, and also it is found that the oxidation-reduction action of the hydrogen gas is exhibited.

Accordingly, when the flow-rate ratio of the oxygen gas to the hydrogen gas, in other words, the ratio of the oxygen gas to the hydrogen gas is set to be less than 65%, with the temperature of the wafer set to be 400° C., and when the gate electrode 32 is restored by plasma oxidation, it is found that the gate electrode 32 made of TiN can be restored while suppressing excessive oxidation of the gate electrode 32.

Figures 4, 5:
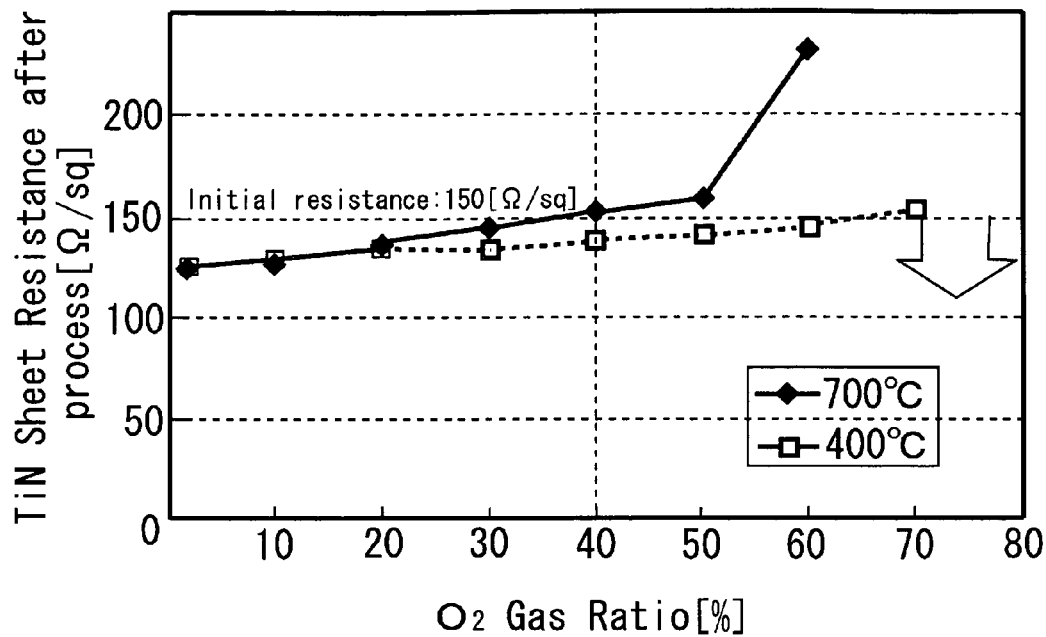
FIG. 4 is a graph chart showing a relation between the flow rate of the oxygen gas to the hydrogen gas, and the sheet resistance values of the gate electrode made of TiN, when a processing temperature is changed.
FIG. 5 is a table chart showing restoring conditions of the gate electrode.

Further, in order to decide a suitable processing temperature of the wafer 200, being other parameter of the restoration step of the gate electrode 32, the inventors of the present invention measured the change of the sheet resistance value, in each case of the cases when the processing temperature of the wafer 200 is set to be constant 400° C., and when the processing temperature of the wafer 200 is set to be constant 700° C. In addition, the inventors of the present invention measured the change of the sheet resistance value when the flow-rate ratio of the oxygen gas to the hydrogen gas is changed with the increment of 10%, namely the change of the resistance value per unit area, in each case of the cases when the processing temperature of the wafer 200 is set to be constant 400° C., and when it is set to be constant 700° C. FIG. 4 is a graph chart showing a relation between the flow-rate ratio of the oxygen gas to the hydrogen gas, and the sheet resistance value of the gate electrode made of TiN. In FIG. 4, the change of the sheet resistance value is taken on the vertical axis, and the flow-rate ratio of the oxygen gas to the hydrogen gas is taken on the horizontal axis. In FIG. 4, symbol □ shows a case that the processing temperature of the wafer 200 is set to be constant 400° C., symbol ♦ shows a case that the processing temperature of the wafer 200 is set to be constant 700° C., respectively. The gate electrode 32 made of TiN is formed in the wafer 200, being an evaluation object, and a total flow rate of the hydrogen gas and the oxygen gas is set to be 1000 sccm. The other condition is the same as the condition of the case of FIG. 3.

As shown in FIG. 4, when the flow-rate ratio of the oxygen gas to the hydrogen gas is increased, it is found that the sheet resistance value of the TiN electrode is increased in proportion to the flow-rate ratio of the oxygen gas to the hydrogen gas, even in each case of the cases when the processing temperature of the wafer 200 is set to be constant 400° C., and when it is set to be constant 700° C. This shows the same result as that of FIG. 3. Note that when the restoration step of the gate electrode 32 is performed, with the processing temperature of the wafer 200 set to be constant 700° C., it is found that the sheet resistance value exceeds the sheet resistance value (Initial value) 150 [Ω/sq] before the restoration step, when the flow-rate ratio of the oxygen gas to the hydrogen gas exceeds 40%. In addition, when the restoration step of the gate electrode 32 is performed, with the processing temperature of the wafer 200 set to be constant 400° C., it is found that the sheet resistance value exceeds the sheet resistance value (Initial value) 150 [Ω/sq] before the restoration step, when the flow-rate ratio of the oxygen gas to the hydrogen gas exceeds 65%.

Further, the inventors of the present invention measured restoration conditions (temperature condition and flow-rate ratio condition) of the gate electrode 32, in a case of forming the High-k gate insulating film 30 by each of the hafnium (HfO), hafnium silicate (HfSiO), and hafnium silicate nitride (HfSiON). FIG. 5 is a table chart showing the restoration conditions (temperature condition and flow-rate ratio condition) of the gate electrode 32.

First, the inventors of the present invention measured a suitable flow-rate ratio of the oxygen gas to the hydrogen gas, while performing the restoration step of the gate electrode 32, for the wafer 200 in which the gate electrode 32 made of TiN is formed on the High-k gate insulating film 30 made of HfO, with the processing temperature set to be not less than room temperature (25° C.) and less than 400° C. As a result, it is found that the flow-rate ratio of the oxygen gas to the hydrogen gas capable of suppressing the excessive oxidation of the gate electrode 32 is larger than 0% and less than 65%. Namely, in a case of HfO, when plasma processing is applied, with the processing temperature of the etching damage of the gate electrode 32 set to be not less than room temperature (25°) and less than 400° C., and the flow-rate ratio of the oxygen gas to the hydrogen gas set to be larger than 0% and less than 65%, it is found that the side face of the gate electrode 32 can be restored without excessively oxidizing the gate electrode 32 made of TiN.

Further, the inventors of the present invention measured the suitable flow-rate ratio of the oxygen gas to the hydrogen gas, while performing the restoration step of the gate electrode 32, for the wafer 200 in which the gate electrode 32 made of TiN is formed on the High-k gate insulating film 30 made of HfSiO, with the processing temperature set to be not less than room temperature (25° C.) and less than 600° C. As a result, it is found that the flow-rate ratio of the oxygen gas to the hydrogen gas capable of suppressing the excessive oxidation of the gate electrode 32 is larger than 0% and less than 40%. Namely, in the case of HfSiO, when plasma processing is applied, with the processing temperature of the etching damage of the gate electrode 32 set to be not less than room temperature (25° C.) and less than 600° C., and the flow-rate ratio of the oxygen gas to the hydrogen gas set to be larger than 0% and less than 40%, it is found that the side face of the gate electrode 32 can be restored without excessively oxidizing the gate electrode 32 made of TiN.

Further, the inventors of the present invention measured the suitable flow-rate ratio of the oxygen gas to the hydrogen gas, while performing the restoration step of the gate electrode 32, for the wafer 200 in which the gate electrode 32 made of TiN is formed on the High-k gate insulating film 30 made of HfSiON, with the processing temperature set to be not less than room temperature (25° C.) and less than 1000° C. As a result, it is found that the flow-rate ratio of the oxygen gas to the hydrogen gas capable of suppressing the excessive oxidation of the gate electrode 32 is larger than 0% and less than 60%. Namely, in a case of HfSiON, when plasma processing is applied, with the processing temperature of the etching damage of the gate electrode 32 set to be not less than room temperature (25° C.) and less than 1000° C., and the flow-rate ratio of the oxygen gas to the hydrogen gas set to be large than 0% and less than 60%, it is found that the side face of the gate electrode 32 can be restored, without excessively oxidizing the gate electrode 32 made of TiN. However, for example, at the processing temperature of 1000° C., the High-k gate insulating film 30 is formed into a polycrystal structure, thus increasing the leak current in some cases. Therefore, the processing temperature is preferably set to be the temperature not allowing the High-k gate insulating film 30 to be crystallized.

(c) In the restoration step of the gate electrode 32 according to this embodiment, after starting the supply of the hydrogen gas into the processing chamber 201, the application of the high frequency electric power to the cylindrical electrode 215 is started after prescribed time t1 delay, and thereafter, the supply of the oxygen gas into the processing chamber 201 is started after further prescribed time delay. Then, the supply start timing of the hydrogen gas into the processing chamber 201, the application start timing of the high frequency electric power to the cylindrical electrode 215, and the supply start timing of the oxygen gas into the processing chamber 201 are adjusted, so that the activation timing of the hydrogen gas supplied into the processing chamber 201 and the activation timing of the oxygen gas supplied into the processing chamber 201 coincide with each other. Thus, the oxidation-reduction action of the hydrogen active species and the oxidation action of the oxygen active species are started at a satisfactory timing, and the side face of the gate electrode 32 is oxidized and restored and the excessive oxidation of the side face of the gate electrode 32 can be suppressed. Namely, the oxygen gas has a characteristic of more easily excited by plasma than the hydrogen gas. However, in the restoration step of the gate electrode according to this embodiment, the oxidation-reduction action of the hydrogen active species and the oxidation action of the oxygen active species are started at a satisfactory timing, in consideration of such a characteristic.

(d) In the restoration step of the gate electrode according to this embodiment, after stopping the supply of the oxygen gas into the processing chamber 201, the application of the high frequency electric power to the cylindrical electrode 215 is stopped after prescribed time t2 delay, and thereafter, the supply of the hydrogen gas into the processing chamber 201 is stopped after further prescribed time t3 delay. Then, the supply stop timing of the oxygen gas into the processing chamber 201, the application stop timing of the high frequency electric power to the cylindrical electrode 215, and the supply stop timing of the hydrogen gas into the processing chamber 201 are respectively adjusted, so that the disappearance timing of the hydrogen active species in the processing chamber 201 and the disappearance timing of the oxygen active species in the processing chamber 201 coincide with each other. Thus, the oxidation-reduction action of the hydrogen active species and the oxidation action of the oxygen active species are finished at a satisfactory timing, and the side face of the gate electrode 32 is oxidized and restored and the excessive oxidation of the side face of the gate electrode 32 can be suppressed. Namely, there is a characteristic that a service life of the oxygen active species excited by plasma is longer than the service life of the hydrogen active species excited by plasma. However, in the restoration step of the gate electrode 32 according to this embodiment, the oxidation-reduction action of the hydrogen active species and the oxidation action of the oxygen active species are finished at a satisfactory timing, in consideration of such a characteristic.

(e) In the restoration step of the gate electrode 32 according to this embodiment, quality of an oxide film for restoring the gate electrode 32 can be improved, if the processing temperature of the wafer 200 is increased as much as possible, while the temperature is set within a range not allowing the High-k gate insulating film 30 to be crystallized.

Second Embodiment of the Present Invention

In the aforementioned embodiment, explanation has been given, with the substrate processing apparatus constituted as the MMT apparatus given as an example. However, the present invention is not limited thereto. For example, the present invention can be suitably applied to the substrate processing apparatus constituted as an ICP (Inductively Coupled Plasma) apparatus and an ECR (Electron Cyclotron Resonance) apparatus.

Figure 7:
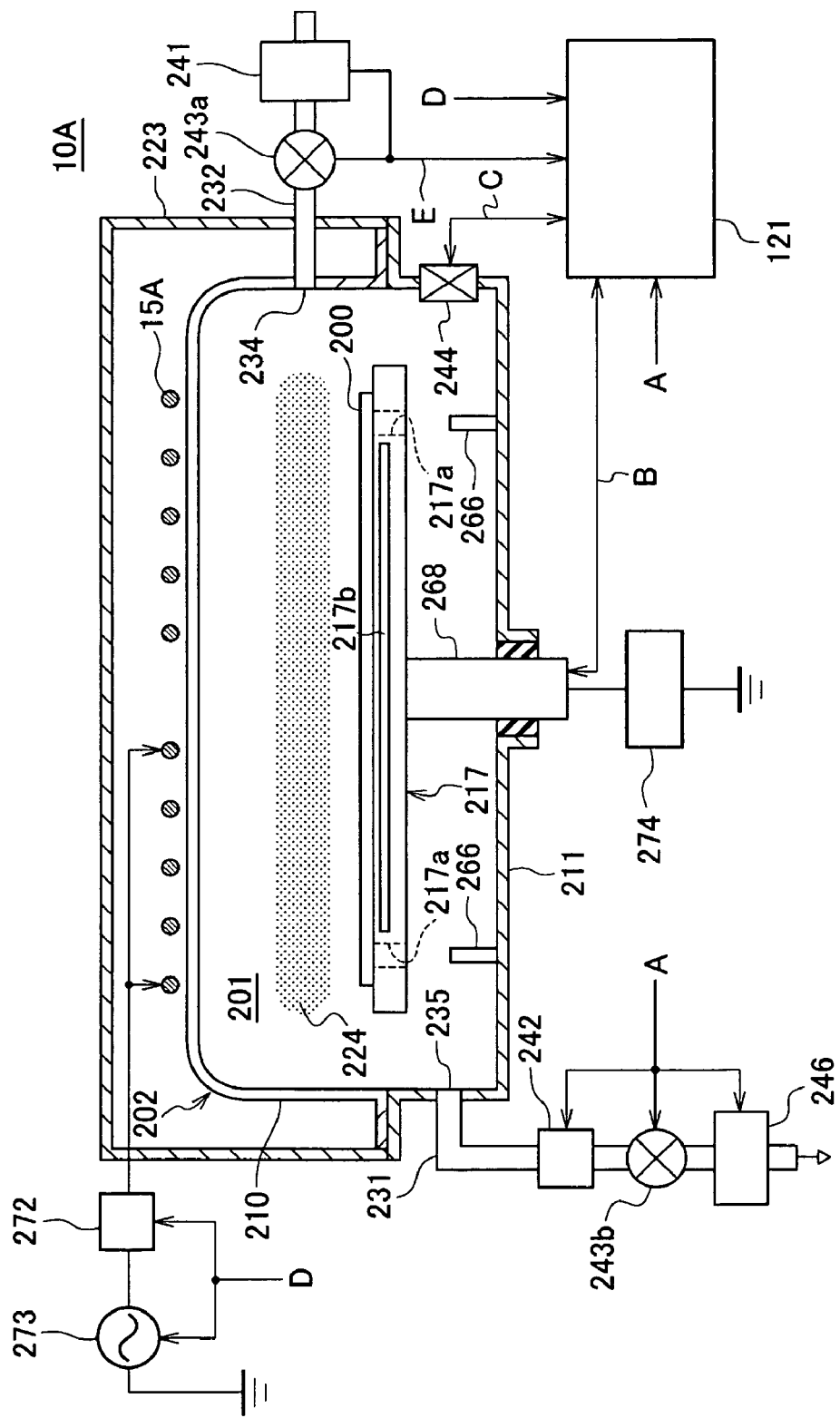
FIG. 7 is a schematic block diagram showing an ICP-type plasma processing apparatus, being the substrate processing apparatus according to a second embodiment of the present invention.

FIG. 7 shows an ICP-type plasma processing apparatus, being the substrate processing apparatus according to the second embodiment of the present invention. In each constituent element of the substrate processing apparatus according to this embodiment, the same signs and numerals are assigned to constituent elements having similar functions as those of the first embodiment.

An ICP-type plasma processing apparatus 10A according to this embodiment includes an induction coil 15A, being a plasma generation part, for generating plasma by supplying electric power thereto, with this induction coil 15A laid on the outside a ceiling wall of the processing vessel 203. In addition, in this embodiment, the gas supply pipe 232 is connected to an upper part of the side wall of the processing vessel 202.

High frequency electric power is flown to the induction coil 15A, being a plasma generation part, while supplying the processing gas 230 into the processing chamber 201 from the gas supply pipe 232, to thereby generate an electric field by electromagnetic induction, and the processing gas 230 supplied into the processing chamber 201 is converted into plasma, with this electric field used as energy. By this plasma, the oxygen active species and the hydrogen active species are generated. By the oxygen active species, the side face of the gate electrode 32 after etching can be oxidized and restored. In addition, by the hydrogen active species, excessive oxidation of the side face of the gate electrode 32 after etching can be prevented. Then, similar advantages as those of the aforementioned embodiment can be exhibited.

Third Embodiment of the Present Invention

Figure 8:
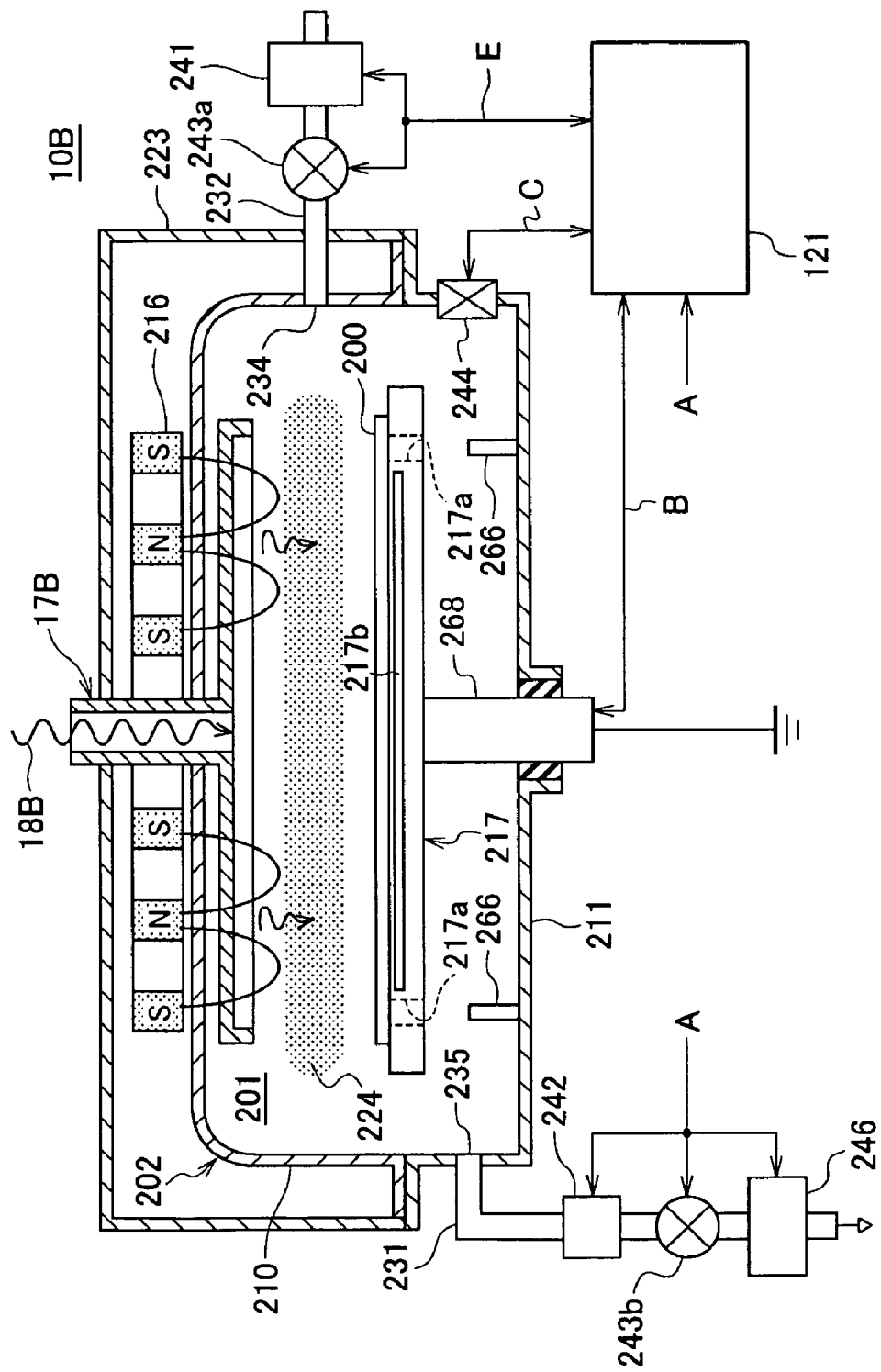
FIG. 8 is a schematic block diagram showing an ECR-type plasma processing apparatus, being the substrate processing apparatus according to a third embodiment of the present invention.
Figure 9:
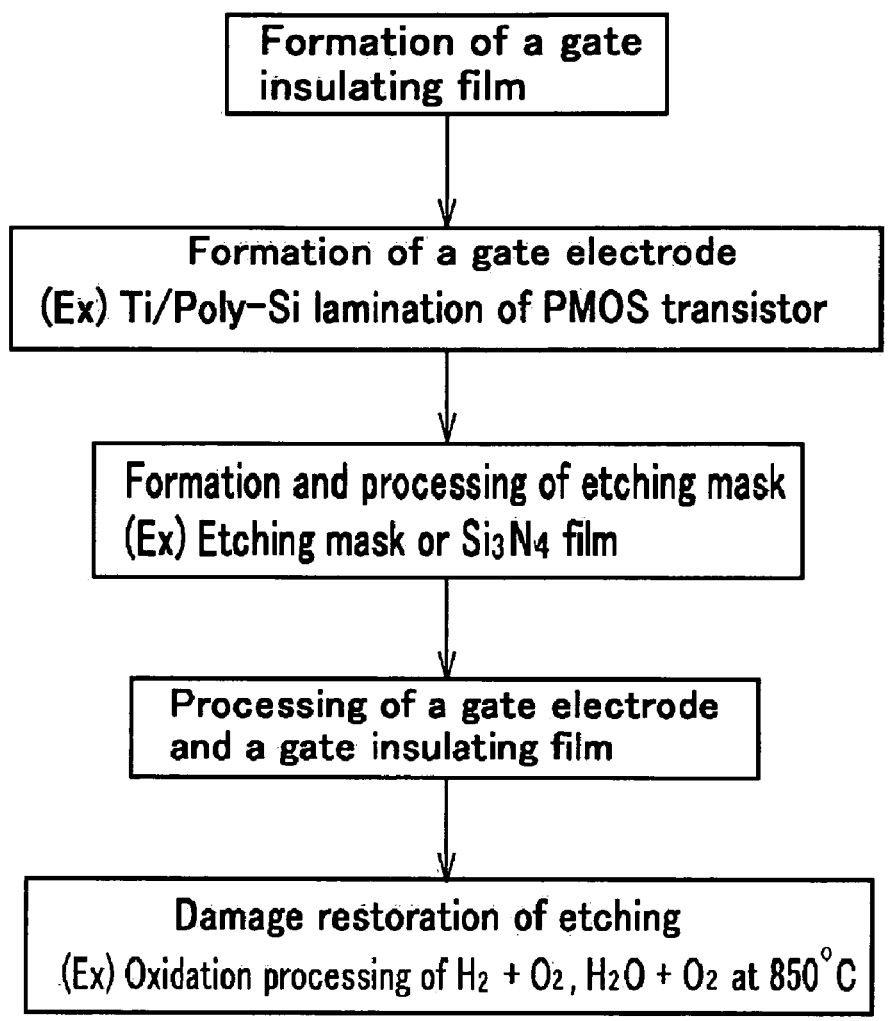
FIG. 9 is a view showing main steps of a conventional process flow of the MOS transistor and typical processing contents of these steps.

FIG. 8 shows the ECR-type plasma processing apparatus, being the substrate processing apparatus according to a third embodiment of the present invention. In each constituent element of the substrate processing apparatus according to this embodiment, the same signs and numerals are assigned to the constituent elements having similar functions as those of the aforementioned embodiment, and detailed explanation therefore is omitted.

An ECR-type plasma processing apparatus 10B according to this embodiment includes a microwave waveguide 17B, being the plasma generation part for generating plasma by supplying microwave thereto. In addition, in this embodiment also, the gas supply pipe 232 is connected to the upper part of the side wall of the processing vessel 202.

The microwave 18B is introduced to the microwave waveguide 17B, being the plasma generation part, while supplying the processing gas 230 into the processing chamber 201 from the gas supply pipe 232, then the microwave 18B is emitted to the processing chamber 201, and by this microwave 18B, the processing gas supplied to the processing chamber 201 is converted into plasma. By this plasma, the oxygen active species and the hydrogen active species are generated. Also, by the oxygen active species, the side face of the gate electrode 32 after etching can be oxidized and restored. Further, by the hydrogen active species, the excessive oxidation of the side face of the gate electrode 32 after etching can be prevented. Then, similar advantages as those of the aforementioned embodiment can be exhibited.

(Additional Description)

The present invention takes several aspects as described below.

(Additional Description 1)

There is provided a manufacturing method of a semiconductor device, including the steps of:

loading into a processing chamber a substrate having a high dielectric gate insulating film and a metal electrode, with a side wall exposed by etching;

applying oxidation processing to the substrate by supplying thereto hydrogen-containing gas and oxygen-containing gas excited by plasma, with the substrate heated to a temperature not allowing the high dielectric gate insulating film to be crystallized, in the processing chamber; and unloading the substrate after processing from the processing chamber.

Preferably, the high dielectric gate insulating film is hafnium, and the temperature is set to be not less than 25° C. and less than 400° C.

Also preferably, the high dielectric gate insulating film is hafnium silicate, and the temperature is set to be less than 600° C.

Also preferably, a flow rate of oxygen components in the oxygen-containing gas is 65% or less of the flow rate of hydrogen components of the hydrogen-containing gas.

(Additional Description 2)

There is provided a substrate processing apparatus, including:

a processing chamber into which a substrate having a high dielectric gate insulating film and a metal electrode, with a side wall exposed by etching, is loaded;

a heating part heating the substrate loaded into the processing chamber;

a gas supply system supplying hydrogen-containing gas and oxygen-containing gas into the processing chamber;

a plasma generation part generating plasma in the processing chamber; and a controller controlling the heating part, the gas supply system, and the plasma generation part, with the controller controlling, so that the substrate is heated using the heating part, to a temperature not allowing the high dielectric gate insulating film to be crystallized; the oxygen-containing gas and the hydrogen-containing gas are supplied into the processing chamber by the gas supply system; then plasma is generated in the processing chamber by the plasma generation part; and the hydrogen-containing gas and the oxygen-containing gas excited by plasma is supplied to the substrate, to thereby apply oxidation processing thereto.

(Additional Description 3)

There is provided a manufacturing method of a semiconductor device, including the step of:

applying plasma processing to a metal electrode on a High-k gate insulating film formed on a processing substrate, in a processing atmosphere including hydrogen gas and oxygen gas, with a ratio of the oxygen gas to the hydrogen gas set to be 65% or less. Here, the metal electrode means a gate electrode. The atmosphere of the mixed gas may be generated by supplying the processing gas containing oxygen and the processing gas containing hydrogen from the same gas supply pipe, or may be generated by supplying them separately from separate gas supply pipes. According to this method, crystallization of the High-k gate insulating film can be prevented, and therefore the leak current can be suppressed.

In this case, the atmosphere is set as a hydrogen gas atmosphere by supplying the processing gas containing hydrogen first, and thereafter by supplying the processing gas containing oxygen gas, mixed gas atmosphere is made containing oxygen gas and hydrogen gas. In this sequence, oxygen is activated by plasma earlier than hydrogen (active species (radical)), and timings of activation of hydrogen and activation of oxygen are matched with each other. When the active species of oxygen remain and the active species of hydrogen disappear first, the side wall of the gate electrode is excessively oxidized, to increase an electricity resistance of the gate electrode. However, in this sequence, increase of the resistance value of the gate electrode can be suppressed, and it becomes possible to respond to the leak current.

In addition, after the supply of the processing gas containing oxygen gas is stopped, the supply of the processing gas containing hydrogen gas is stopped. Oxygen is activated longer than hydrogen and having a long life. Therefore, in order to make disappearance timings of the hydrogen active species and the oxygen active species matched with each other, the supply of the processing gas containing oxygen and the processing gas containing hydrogen is stopped in this order. When the oxygen active species remain in the processing chamber and the hydrogen active species disappear, the gate electrode is excessively oxidized and the electricity resistance of the gate electrode is increased. However, this makes it possible to suppress the increase of the resistance value.

(Additional Description 4)

There is provided a manufacturing method of a semiconductor device, wherein the High-k gate insulating film is made of HfO, and the processing temperature is less than 400° C.

According to this method, when the High-k gate insulating film is made of HfO, the gate electrode is restored at a temperature not allowing HfO to be crystallized.

In this case, the ratio of the oxygen gas is set to be less than 65%. When the ratio of the oxygen gas to the hydrogen gas is set to be less than 65%, the gate electrode is restored at a temperature not allowing HfO to be crystallized when the High-k gate insulating film is HfO, and this makes it possible to respond to the leak current.

(Additional Description 5)

There is provided a manufacturing method of a semiconductor device, wherein the High-k gate insulating film is made of HfSiO, and the processing temperature is set to be less than 600° C.

According to this method, the gate electrode is restored at a temperature not allowing HfSiO to be crystallized, when the High-k gate insulating film is HfSiO. In this case, the ratio of the oxygen gas is set to be less than 40%. When the ratio of the oxygen gas to the hydrogen gas is set to be less than 40%, the gate electrode can be restored at a temperature not allowing HfSiO to be crystallized when the High-k gate insulating film is HfSiO, and this makes it possible to respond to the leak current.

Note that a SiON film may be formed for suppressing the leak current, on a boundary face between the High-k gate insulating film 30 and the wafer 200. Thus, the present invention can be variously modified and it is a matter of course that the present invention is applied to this modified invention.

What is claimed is:

1. A manufacturing method of a semiconductor device, comprising:

loading into a processing chamber a substrate having a high dielectric gate insulating film and a metal electrode, with a side wall exposed by etching; and applying oxidation processing to the substrate by supplying thereto hydrogen-containing gas and oxygen-containing gas excited by plasma, with the substrate heated to a temperature not allowing the high dielectric gate insulating film to be crystallized, in the processing chamber; and unloading the substrate after processing from the processing chamber;

wherein, in the step of applying the oxidation processing, the supply of the hydrogen-containing gas into the processing chamber is started, and thereafter, the supply of the oxygen-containing gas into the processing chamber is started after a prescribed time delay, so that the activation timing of the hydrogen-containing gas and the activation timing of the oxygen-containing gas coincide with each other.

2. The manufacturing method of the semiconductor device according to claim 1, wherein the high dielectric gate insulating film is hafnium, and the temperature is set to be not less than 25° C. and less than 400° C.

3. The manufacturing method of the semiconductor device according to claim 1, wherein the high dielectric gate insulating film is hafnium silicate, and the temperature is set to be less than 600° C.

4. The manufacturing method of the semiconductor device according to claim 1, wherein a flow rate of oxygen components in the oxygen-containing gas is 65% or less of a flow rate of hydrogen components of the hydrogen-containing gas.

5. The manufacturing method of the semiconductor device according to claim 2, wherein a flow rate of oxygen components in the oxygen-containing gas is 65% or less of a flow rate of hydrogen components of the hydrogen-containing gas.

6. The manufacturing method of the semiconductor device according to claim 3, wherein a flow rate of oxygen components in the oxygen-containing gas is 65% or less of a flow rate of hydrogen components of the hydrogen-containing gas.

7. The manufacturing method of the semiconductor device according to claim 1, wherein, in the step of applying the oxidation processing, the supply of the oxygen-containing gas into the processing chamber is stopped, and thereafter the supply of the hydrogen-containing gas into the processing chamber is stopped after another prescribed time delay, so that disappearance timing of the hydrogen active species generated by exciting the hydrogen-containing gas by the plasma, and disappearance timing of the oxygen active species generated by exciting the oxygen-containing gas by the plasma, coincide with each other.

* * * * *